(12) United States Patent
Epstein

(10) Patent No.: US 7,327,547 B1
(45) Date of Patent: Feb. 5, 2008

(54) CIRCUIT ELEMENT AND USE THEREOF

(76) Inventor: Barry M. Epstein, 3 Milford Pl., Dallas, TX (US) 75230

( * ) Notice: Subject to any disclaimer, the term of this patent is extended or adjusted under 35 U.S.C. 154(b) by 58 days.

(21) Appl. No.: 11/335,571

(22) Filed: Jan. 20, 2006

(51) Int. Cl.
*H02H 1/00* (2006.01)
(52) U.S. Cl. ........................ 361/212; 361/220
(58) Field of Classification Search .......... 361/212
See application file for complete search history.

(56) References Cited

U.S. PATENT DOCUMENTS

| | | | | |
|---|---|---|---|---|
| 4,208,696 A | * | 6/1980 | Lindsay et al. | 361/212 |
| 4,231,901 A | * | 11/1980 | Berbeco | 252/511 |
| 4,564,880 A | * | 1/1986 | Christ et al. | 361/212 |
| 5,398,153 A | * | 3/1995 | Clough et al. | 361/212 |
| 5,534,344 A | * | 7/1996 | Kisu et al. | 428/323 |
| 5,719,739 A | * | 2/1998 | Horiguchi | 361/220 |
| 6,690,564 B1 | * | 2/2004 | Haruta et al. | 361/212 |
| 2002/0027761 A1 | * | 3/2002 | Ober | 361/220 |

\* cited by examiner

*Primary Examiner*—Michael Sherry
*Assistant Examiner*—Tien Mai
(74) *Attorney, Agent, or Firm*—Terry M. Gernstein

(57) ABSTRACT

A circuit element includes a foam pad having a plurality of electrically conductive granules some of which are in electrical contact with each other and some of which are spaced apart from each other and an electrical path defined through the pad by the granules. The pad has a very high resistance which is a function of the geometry of the pad as well as the electrical path. The pad can be used to dissipate ESD as well as a resistor element. The pad is very versatile and can be used in a large number of situations and in conjunction with other circuit elements.

43 Claims, 6 Drawing Sheets

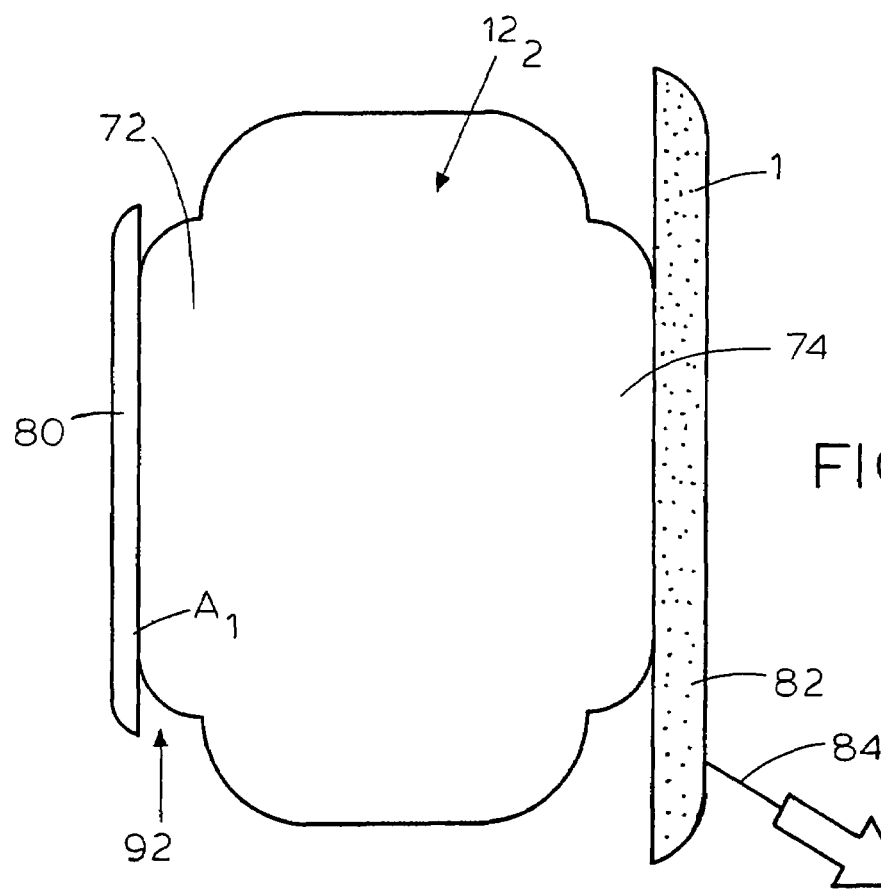
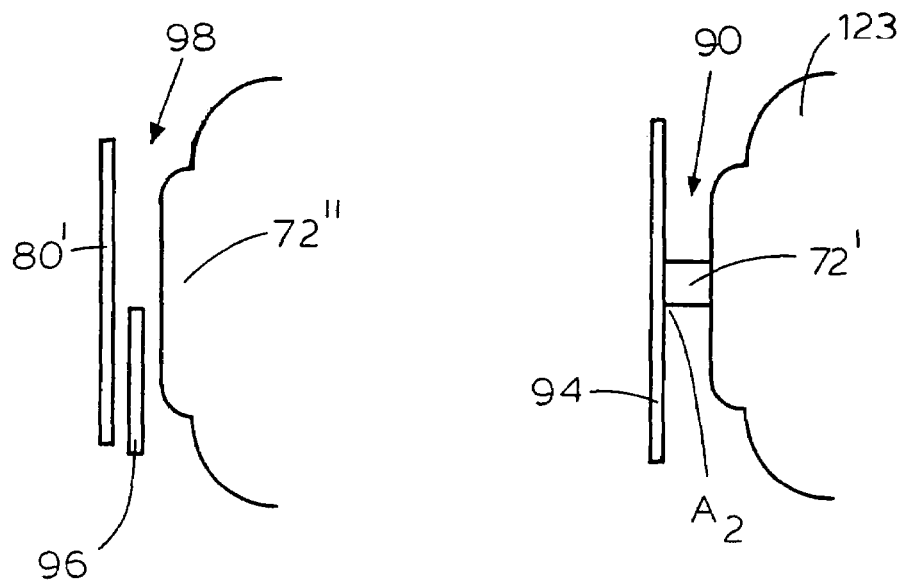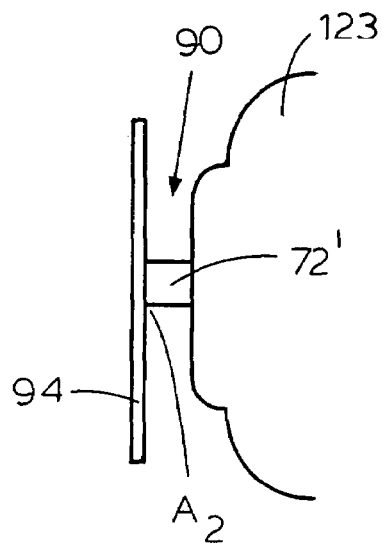

CIRCUIT ELEMENT AND USE THEREOF

TECHNICAL FIELD OF THE INVENTION

The present invention relates to the general art of electronics, and to the particular field of electronic elements and systems.

BACKGROUND OF THE INVENTION

The problem of electrostatic discharge (ESD) is well known. From merely receiving a mild shock after crossing a room and touching a metal object, to sending a shock into electronic equipment, nearly everyone has experienced an ESD problem at some time.

While static electricity is extremely complex, several overall theories are generally accepted with regard to the action of ESD. Static electricity charges on a person or object are generally like charges (that is, the charges are all positive or all negative). As such, as static electricity charges build up on a person or object, these charges tend to migrate as far apart from each other as possible as determined by the geometry of the person of object. Thus, for example, it is common for static electricity charges to migrate to a person's fingertips. For this reason, when that person reaches out to touch an electrically conductive object, a spark will jump the gap between that person's fingertips and the object based upon the potential difference between the fingertips and the object. This discharge is very rapid and can be quite violent. If the electrically conductive object is sensitive electronic equipment, that equipment may be damaged either from the magnitude of the discharge and/or from the speed of the discharge. At the least, the charge could cause the equipment to execute an error. A sufficient number of such discharges may eventually damage the equipment.

Accordingly, the art contains many inventions intended to protect equipment or a person from the effects of this sudden, and sometimes violent, discharge associated with ESD.

For instance, in the logging industry where chains are lowered by helicopter to loggers waiting on the ground to fasten fresh-cut timber to them so it could be airlifted to the sawmill or nearby waterway, track access point or the like, the loggers are often reluctant to grab the chain because of a painful shock that may occur as a result of a buildup of static electricity which will be discharged to ground through their bodies. This particular problem has been solved by incorporating a resistance in the line from the charge-carrying object, such as the helicopter, to the person on the ground. The high resistance causes the current to be low enough that the discharge will not be painful.

However, it may be cumbersome or inconvenient to include a resistance in the line itself. This solution may be even more cumbersome if the person is an office worker who moves around a great deal. Accordingly, this solution to the ESD problem has serious shortcomings.

Accordingly, there is a need for a system that protects a person against the effects of ESD but can do so in a manner that does not interfere with any task the person may be performing and further will not be cumbersome or burdensome for the person to use.

While many devices currently on the market work well, there are several problem areas not addressed thereby. This results in drawbacks and disadvantages for such devices when a person or equipment are situated in certain environments or subject to certain conditions.

First, no matter how effective a touch pad is it will be totally ineffective if the person does not use it. That is, if the person carrying a large ESD charge forgets to touch the touch pad and proceeds to touch a computer, the ESD will discharge through the computer and the touch pad will have been useless. Thus, a shortcoming of such touch pads is that they require the person to remember to use it.

Furthermore, no matter how effective the ESD protection device is, the current level and/or the change in current level may be so high that either the person or the equipment can be damaged.

Still further, while placing a touch pad on a computer may protect the computer it does not protect the user from the effects of an electrostatic discharge.

As mentioned above, the majority of applications for the prevention of ESD are in the manufacturing or medical fields and are largely concerned with protecting the 'manufacturing' process or sensitive components for ESD damage. Examples include moving mediums such as the manufacture of rolls of paper, the assembly of delicate electronic chips and circuitry and surgeon-patient contact during an operation.

An analysis of each of the above will help illustrate the shortcomings of the prior art. In the manufacture or printing of paper, long rolls of paper may move at high speed. Often the path may involve rubber or other rollers and guides. As the paper rubs across such items a static electricity charge may be generated. Since the paper path is well controlled, it is an easy process to place grounded conductive brushes or flat metal springs in contact with the moving paper since the paper stays in a fixed path. Such electrodes are connected directly to the grounded frame of the associated machinery or to another path eventually leading to earth ground or other equalizing means.

Another common application of ESD control is in the production or repair of fragile electronics such as computer circuit boards. Even a slight electrostatic discharge through a sensitive device may destroy it. Therefore, significant effort and cost is devoted to eliminating the possibilities of electrostatic potentials in the vicinity of the sensitive electronics. Typically, a single ground point is provided that all associated elements are connected to so that no electrostatic potential can exist between them that might flow through the sensitive electronics. For example, a conductive floor mat is provided that is connected to the ground point, or a work surface mat that is conductive (or dissipative) is also provided that is wired to the same ground point, the work table frame and any test equipment is connected to the same point, finally the assembly person is also connected to the same point, typically by a wrist strap tether. The tether generally consists of a wrist pad and grounding wire that is eventually connected back to the single ground point. For operator safety, the ground wire typically contains a 1 Meg resistor to limit current flow to safe levels should the operator come in contact with 120 volts AC. This tethering restraint is inconvenient and not considered suitable for a typical office worker or call center operator. The single ground point is eventually connected to true earth ground or other equalizing point by another conductor.

Applications are similar in the medical field, employing similar tethers and/or foot/shoe connectors also considered impractical for the typical office worker environment.

Today, a new set of ESD problems is emerging in the typical work place or home office environment. Today, a typical worker may exist in a virtually electrically isolated environment—a plastic computer case, plastic keyboard, plastic control knobs on a molded plastic control panel, plastic office chair with man-made fabric and plastic wheels, non-conductive flooring or carpeting and even a headset with foam or molded plastic earpieces and plastic microphone tube.

As the operator moves in his/her chair, there are many opportunities for a very large electrostatic charge to build up on his/her body. Friction between dissimilar materials is the classical means for generation of electrostatic voltages. There are many such situations that exist continually in the operator environment today—the operator's clothing sliding against the chair back or arm rests, the operator's shoes sliding on the carpet, the plastic chair wheels sliding against the carpet are a few examples. The effects can be cumulative over a long period of time, and can become quite high.

Eventually a discharge or equalization to (true earth) ground must take place. The higher the value of the electrostatic voltage charge, the greater the distance the charge may 'jump' to discharge, and the more 'catastrophic' the event to the operator. This is an example of corona discharge. For example, there are many documented cases of operators in call centers experiencing a very loud pop or explosion in their ear, ear pain, and even bleeding in the ear as the discharge path appears to take place through the operator's headset. Other documented cases include severe neck pain, nausea, numbness, elevated blood pressure and rapid heart beat.

There are many possibilities as to why these effects are worse than the typical nuisance static electricity charges walking around the house. For instance, the discharge path may be more surprising or appear worse to the user if it involves the user's ear. Recently, this has been attributed to electrostatic discharge of the operator with the grounding mechanism being the metallic portion of the ear piece coupled to its metallic conductors and eventually to earth ground through its associated electronics. This may be a direct low impedance ground or it might be a higher impedance which is still sufficiently low with respect to that needed to successfully equalize the static charge. Still in other cases, as explained below, the associated electronics may potentially make the discharge injury to the person more severe and disturbing by causing a high current pulse to take place as the discharge event. This effect may be further compounded by allowing the operator to be exposed to other voltage or leakage paths developed via the ear over time.

In some cases, the associated electronics may experience physical damage or processing disturbances due to the operator electrostatic discharge. For example, the headphone circuit might involve a transformer with a 600 to 1000 volt breakdown rating between its windings (connected to the headset diaphragm) and conductive metal core. However, the electrostatic voltage on the operator may exceed 15,000 volts—far more than the design tolerance of the transformer. Should the transformer be exposed to such excessive high voltage, a 'breakdown' or 'shorting' may occur. Thus, the operator electrostatic voltage might cause a 'short circuit' insulation breakdown or lower resistance to develop between the headset winding (secondary) and primary winding which may be at a constant high voltage level with respect to ground or the transformer core which may be connected to earth ground, thus completing the discharge path.

The transformer breakdown may cause a permanent equipment failure. Other equipment damage or errors can also occur due to the electrostatic discharge event. The electrostatic discharge event may cause an electromagnetic or radio frequency pulse to be generated. This pulse may radiate or migrate into nearby circuitry causing errors in processing or noise in audio or video circuits. Although a transformer discharge event has been described above, other similar discharge paths can be envisioned, with similar catastrophic results. Since many electronic devices are connected together by some path, including a ground path, it is easy to understand from the foregoing that a pulse or an ESD event in one area can have consequences in other areas as well unless the event is controlled and contained.

With continued miniaturization of electronics, the problems may become more severe as circuit component voltage tolerances become less and enclosure insulation distances become less.

Accordingly, there is a need for an ESD protection system that protects a person and electronics from the effects of ESD, even if that person is in an environment that is intended to nominally insulate that person from ground.

As the cost of doing business increases, many businesses are reluctant to purchase new equipment. Thus, it is most advantageous if existing equipment can be easily modified or retrofit to achieve new and improved results. This is the situation with protecting people from the effects of ESD. Thus, there is a need for a system for protecting people against the effects of ESD that can easily be retrofit onto existing equipment.

There are also other needs for protection from ESD. As new wiring is being installed by being pulled through raceways and conduits, an electrostatic charge may be generated along the cable. This may cause arc-over damaging the cable itself, damage to equipment when connected to it, shock to the person installing the cable and latent damage. Fire and explosions in gas stations during fuel purchase are also a similar ESD problem.

An overall system for protecting a person or equipment from the effects of ESD is disclosed in patent application Ser. No. 09/934,047 which is now U.S. Pat. No. 6,873,516 and in application Ser. No. 10/112,952, which is now U.S. Pat. No. 6,987,659. The disclosures of these two documents are incorporated herein by reference thereto.

Important aspects of any circuit element, no matter what its application, are ease of use and the ease with which the element can be designed or modified to accommodate a particular situation. That is, it is important that a circuit element be easily modified to account for factors that may be influenced by the particular situation.

Accordingly, while the present invention is being disclosed in conjunction with ESD, those skilled in the art will understand, based on the teaching of this disclosure, that the invention has applications that are much broader than the ESD field. For example, the invention can be used anywhere an element having high resistance can be used or is required without departing from or exceeding the scope of the present disclosure.

For purposes of this disclosure, it is noted that the term "dissipative" will refer to resistance values in excess of $10^7$ ohms and can be as high as $10^{12}$ ohms.

OBJECTS OF THE INVENTION

It is a main object of the present invention to provide a circuit element that can be easily modified and customized according to the requirements of a particular application.

It is another object of the present invention to provide a dissipative circuit element.

It is another object of the present invention to provide a carefully controlled ground discharge path.

It is another object of the present invention to provide a ground discharge path that minimizes radiated disturbances to nearby equipment.

It is another object of the present invention to provide a discharge path that minimizes conducted disturbances to interconnected equipment.

It is another object of the present invention to provide a convenient earthing or equalization means.

It is another object of the present invention to support other work necessities of the operator such as operation of a computer mouse, keyboard, track ball or similar needs.

It is another object of the present invention to provide a grounding means via an existing ground of the associated electronics limiting the discharge current to a minimal value and waveshape so the operation of the associated electronics is not degraded.

It is another object of the present invention to provide an ESD suitable grounding means via existing signal conductors of the associated electronics limiting the discharge current to a minimal value and waveshape so the operation of the associated electronics is not degraded.

It is another object of the present invention to provide a convenient connection means for retrofit or connection in the field to existing systems by an unskilled person.

It is another object of the present invention to protect a person from the effects of ESD without requiring that person to wear any cumbersome wearing apparel.

It is another object of the present invention to protect a person from the effects of ESD without requiring the person to remember to carry out any special operation.

It is another object of the present invention to prevent or reduce an uncomfortable, disturbing or harmful electrostatic discharge to a person.

It is another object of the present invention to prevent or reduce an electrostatic discharge that might interfere with a person's ability to carry out his or her job.

It is another object of the present invention to provide a system to equalize (drain or discharge) an electrostatic charge from a person in a safe, harmless, nonnoticeable or minimally noticeable manner.

It is another object of the present invention to provide a contact surface to the person that is compatible with their normal (workspace) environment and provides discharge contact in the normal course of the operator's activities.

It is another object of the present invention to minimize the static shock that may take place upon initial contact by a prior-charged person.

It is another object of the present invention to provide retrofit kits compatible with control apparatus or other touch means applicable to the particular work set up to protect against ESD.

It is another object of the present invention to provide retrofit kits which can include a contact element, such as a plate, mat, faucet, handle, keyboard key, mouse, mouse pad, headset, microphone, or any of the items mentioned in this disclosure, the circuit elements mentioned in this disclosure and a connection element such as mentioned in this disclosure for connecting the assembly to ground or ESD-suitable ground.

It is another object of the present invention to protect a person from the effects of ESD.

It is another object of this present invention to define a mini version of the system of the present invention to stop or reduce nuisance shocks around houses or the workplace. For example it may mount on light switches, metal door frames, file cabinets, frames of modular office panels, front of stereo equipment or any electronic equipment where user is otherwise isolated from natural discharge paths prior to the time of contact.

It is another object of the present invention to provide a convenient system for connecting one or more conductors relating to equipment or objects desired to be grounded.

It is another object of the present invention to provide current limiting safety in situations where high-impedance grounding is acceptable or desirable.

It is another object of the present invention to provide a secure means for attaching wiring connecting to devices to be protected.

It is another object of the present invention to provide circuitry in applicable cases to enhance human safety and/or reduce ground currents which might cause equipment upset or damage.

It is another object of the present invention to provide a circuit which can be used to provide suitable ESD dissipation in cases where there is not a convenient typical low impedance ground present.

It is another object of the present invention to provide a circuit or a circuit element which can be used in a wide variety of locations, including in a plug.

It is another object of the present invention to provide a system and method of protecting equipment or people against the effects of electrostatic discharge (ESD).

It is another object of the present invention to provide a system and method of preventing corona discharge.

It is another object of the present invention to provide a circuit or a circuit element which can be used in the situations disclosed in the incorporated documents.

SUMMARY OF THE INVENTION

These, and other, objects are achieved by a circuit element that includes a body formed of flexible foam material and having an internal structure formed by a plurality of cell-shaped structures, each cell-shaped structure including a plurality of edges with a plurality of electrically conductive granules located on the edges of each cell-shaped structure, some of the granules being in electrical contact with each other and some of the electrically conductive granules being spaced apart from each other. Foam material is interposed between adjacent spaced apart electrically conductive granules, the foam material that is interposed between adjacent spaced apart electrically conductive granules and is electrically insulating so that the adjacent spaced apart electrically conductive granules having foam material interposed therebetween are electrically insulated from each other. An electrically conductive path is defined through the body by the electrically conductive granules and is defined by the location, orientation and spacing of the electrically conductive granules that are in electrical contact with each other and along with the foam material that is interposed between some adjacent granules. The body has an electrical resistance that is a function of the internal structure and geometry of the body and has an electrical resistance which is greater than $10^8$ ohms to be dissipative. Two electrical contact elements are electrically connected to the body. The electrical contact elements are in electrical series with the electrically conductive path defined through the body, and each contact element is in contact with the foam body over a defined area of contact which includes some of the electrically conductive path. The overall resistance of the body and the electrical contact elements is a function of the internal structure and geometry of the foam body and the geometry of the defined areas of contact between the electrical contact elements and the body.

One application of the circuit element of the present invention is in dissipating ESD in the system disclosed in the incorporated patent documents which disclose systems which protect a person from ESD by reducing static charges on a person to low levels on a periodic basis as the charges are built up. Another application places the resistor element of the present invention in a plug.

It is noted that for purposes of this disclosure, the word conductive will be used to refer to the electrostatic discharge contact area being discussed in the general sense unless otherwise noted. In the true sense of the ESD definition that term means all but insulators. In the strict ESD discussion, conduction typically refers to resistances of 0 to 0.1 megohm, dissipative typically refers to 0.1 megohm to about $10^{12}$ ohms, and as used herein, between $10^8$ and $10^{12}$ ohms, and above that as insulative or non-conductive.

An inductance can be added to limit the development of radiated or conducted high frequency, high impulse leading edges of current or voltage which may upset or damage nearby or connected electronics. The high series resistance of the circuit element embodying the present invention further limits total current to a value such that static electric charges are not significant if superimposed upon logic or logic ground conductors. The geometry of the circuit element as well as the geometry of the personnel contact means (such as pads or electrodes), and the series resistor values can be varied to permit further selection and variation to minimize the magnitude of uncomfortable personnel static shock. The high resistance also limits current flow to the user if instead of ground the grounding (dissipation) wire comes in contact with a high voltage source. The value of resistance can be quite high and the large resistance prevents a person from receiving a significant shock if they have a charge when they initially contact the contact element. That is, the large resistance is a balance between actually connecting a contact point to a grounding circuit (which would provide a path for a significant walk-up shock to occur) and preventing a walkup shock by "isolating" the contact device from the grounding circuit. Points of contact to the user are designed to be those that the user touches continually or intermittently in the normal course of operation. Examples may include conductive mouse pads, conductive elements on the surface of a computer mouse or computer keyboard, trackball, conductive knobs or elements on a mixing panel, conductive elements on the headband or earpieces of a headset worn by the user, often used controls or touch points on virtually any type of user-operated equipment. A convenient earthing means can be provided to drain off the static current so the charge may be effectively equalized.

The element and system disclosed herein will permit the use of discharge methods which will prevent the build up of static discharge and will prevent the build up from reaching values large enough to produce an uncontrolled discharge to a person or to equipment which could damage the person or the equipment, or at the very least, frighten a person.

The system disclosed herein can be placed in any suitable location and is very versatile so it can be used in a wide variety of situations. The device can even be placed in a plug.

Other systems, methods, features, and advantages of the invention will be, or will become, apparent to one with skill in the art upon examination of the following figures and detailed description. It is intended that all such additional systems, methods, features, and advantages be included within this description, be within the scope of the invention, and be protected by the following claims.

BRIEF DESCRIPTION OF THE DRAWING FIGURES

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

FIG. 6 shows another application of the resistor element of the present invention.

FIG. 7 shows another application of the resistor element of the present invention.

FIG. 8 shows another application of the resistor element of the present invention.

DETAILED DESCRIPTION OF THE INVENTION

Figure 1:
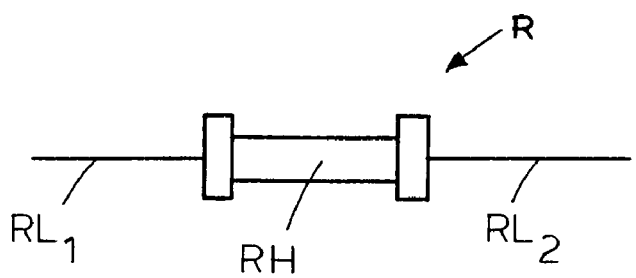
FIG. 1 shows a prior art resistor element.

Referring first to FIGS. 1-4, the basic concept underlying the resistor element embodying the present invention can be understood. As indicated in FIG. 1, a resistor element R as well known in the prior art includes a housing RH which encases a resistive element or other resistive material used in such prior art resistor elements. Leads $RL_1$ and $RL_2$ are suitably connected to the resistor element to connect that resistor into a circuit in the well known manner. As mentioned above, resistor R is difficult to customize to the needs and requirements of a particular application and may have a resistance that is low for ESD purposes. As also discussed above, for the purposes of this disclosure, the word conductive will be used to refer to the electrostatic discharge contact area being discussed in the general sense unless otherwise noted. In the true sense of the ESD definition that term means all but insulators. In the strict ESD discussion, conduction typically refers to resistances of 0 to 0.1 megohm, dissipative typically refers to 0.1 megohm to about $10^{12}$ ohms, and as used herein, between $10^8$ and $10^{12}$ ohms, and above that as insulative or non-conductive.

Figure 2A:
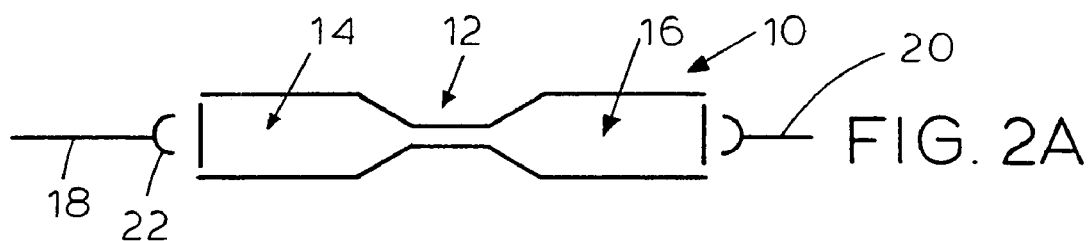
FIG. 2A is a sketch of a resistor element embodying the teaching of the present invention.

As shown in FIG. 2A, a body 10 formed of foam material (which will be discussed in greater detail below) is shaped into any suitable geometric form, in the case shown in FIG. 2A, a polygon having a neck section 12 located between two pentagonal sections 14 and 16. In general, body 10 has a plurality of different size surfaces with adjacent surfaces being joined together at a corner having a non-zero angle, and the necked configuration is merely an example of the many different configurations that are possible and which will fall within the scope of this disclosure. As will be discussed below, body 10 is formed of a particular foam material having certain properties that permit that body to act as a resistor element suitable for use in ESD applications and which can be modified to meet the particular needs and requirements of a particular situation. Leads 18 and 20 are electrically connected to the foam body, as by direct connections, such as direct connection 22, or by prongs, such as prongs 24. The leads can also be simply pushed into the body since the body is foam. Because the body is foam material, it is easily shaped and modified to meet the needs and requirements of each situation. Therefore, the geometric shapes shown in FIGS. 2A and 2B are intended to be examples only and are not intended to be limiting as those skilled in the art will be able to design any suitable shape for the foam body based on the teaching of this disclosure and such designs are also intended to be within the scope of this disclosure and the claims associated therewith.

Figure 3:
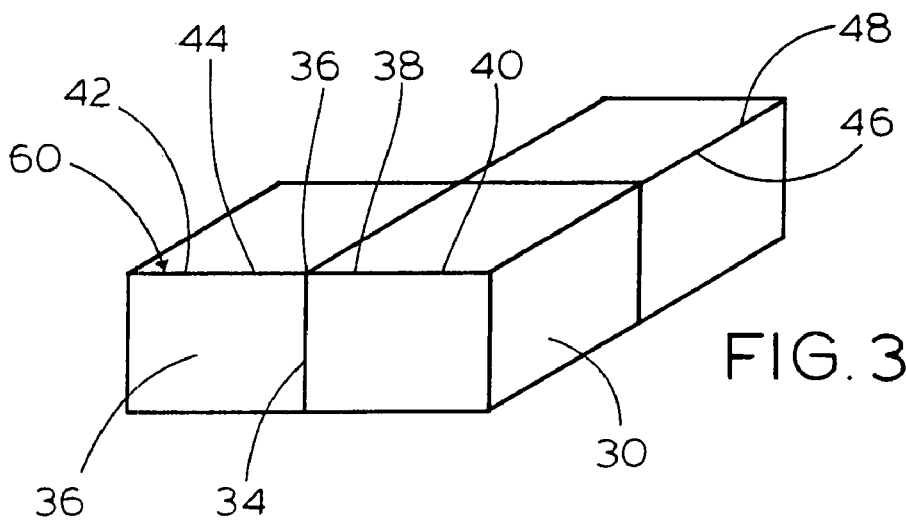
FIG. 3 is a sketch showing the internal structure of the resistor element embodying the teaching of the present invention.
Figure 4:
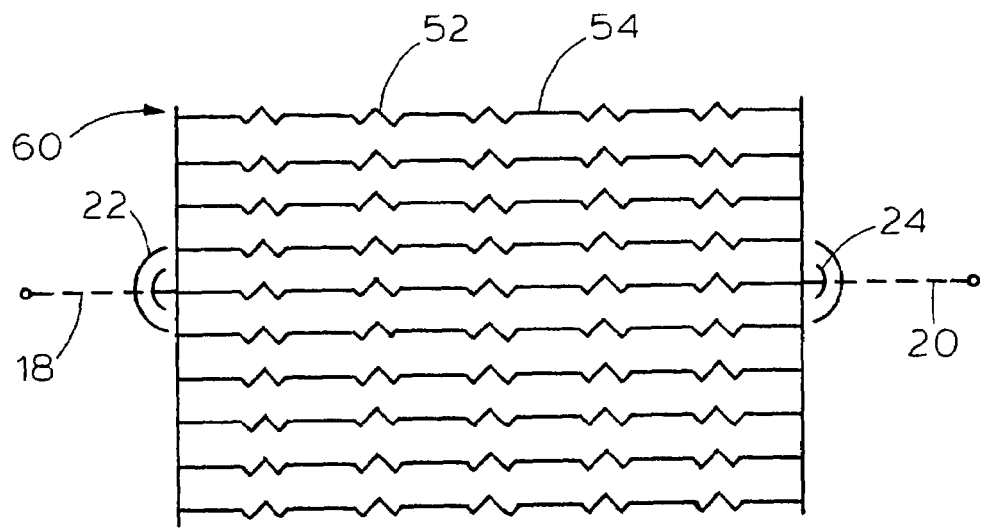
FIG. 4 is a sketch indicating some of the resistor equivalents of the resistor element of the present invention.

The internal structure of the foam body is indicated in FIG. 3 and an equivalent resistance mesh is indicated in FIG. 4. As shown in FIG. 3, the internal structure of the foam body includes a plurality of polygon-shaped cells, such as cell 30. Each cell includes a plurality of edges, such as edge 32, with adjacent cells having common edges, such as edge 34 which is an edge in cell 30 and in cell 36. The cells are hollow inside whereby the foam body is flexible. A plurality of electrically conductive granules, such as electrically conductive granules 38-40, are located on the edges of each cell-shaped structure. Some of the granules, such as granules 42 and 44, are in electrical contact with each other and some of the electrically conductive granules, such as granules 46 and 48, are spaced apart from each other. Foam material is interposed between adjacent spaced apart electrically conductive granules. The foam material that is interposed between adjacent spaced apart electrically conductive granules is electrically insulating so that the adjacent spaced apart electrically conductive granules having foam material interposed therebetween are electrically insulated from each other. This is indicated in FIG. 4 by the resistors, such as resistor 52, which are in a mesh-like configuration, with the resistors representing the foam material and nodes, such as node 54, representing granules that are in electrical contact with each other. The mesh shown in FIG. 4 is planar, but the mesh, in reality is three-dimensional with resistors and nodes being located on the depth and height dimensions as well as the width dimension such as visible in FIG. 4.

An electrically conductive path is defined through the body by the electrically conductive granules and is defined by the location, orientation and spacing of the electrically conductive granules that are in electrical contact with each other and along with the foam material that is interposed between some adjacent granules. Thus, an electrically conductive path 60, through the foam body will include electrically contacting elements such as elements 42 and 44 and will extend through the foam body in a tortuous path the direction of which will be influenced by the insulating foam material that separates some granules while other granules are in electrical contact with each other. Due to the great number of electrically conductive granules, at least one path which is continuous will be defined through the foam body. Due to the location, spacing and orientation of the granules that are in electrical contact and the granules that are insulated from each other, the body will have an electrical resistance that is a function of the internal structure and geometry of the body. The nature of the foam material is selected so that the overall electrical resistance of the foam body is greater than $10^8$ ohms, and the foam body is thus dissipative.

Figure 2B:
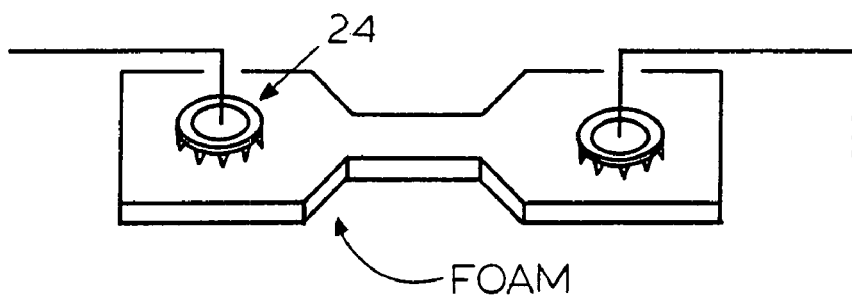
FIG. 2B is a sketch of another form of the resistor element embodying the teaching of the present invention.

As indicated in FIGS. 2A and 2B, electrical contact elements can be electrically connected to the body either via another electrical element or directly contacting the body as by simple insertion into the foam body. The electrical contact elements are in electrical series with the electrically conductive path defined through the body, and each contact element is in contact with the foam body over a defined area of contact which includes some of the electrically conductive path. As can be understood from the teaching of the above discussion, the overall resistance of the body and the electrical contact elements is a function of the internal structure and geometry of the foam body and the geometry of the defined areas of contact between the electrical contact elements and the body.

The inventor notes that foam materials having a suitably high surface resistivity used in packaging can be a suitable materials for use in the system embodying the present invention. However, there is no disclosure anywhere teaching that packaging materials could be used as an electrical resistor element. It is also noted that while foam has been disclosed, other similar materials, such as epoxies or suitable plastic electrostatic resistive molding compounds that have the properties discussed herein with conducive materials that are in electrical contact with each other in some portions thereof and are spaced apart from each other in other portions thereof to define an electrically conductive path through a material having a high surface resistivity, can be used in the system embodying the present invention without departing from the scope of this disclosure and the claims appended hereto.

Basically, the resistor element of the present invention can be used exactly as if it were a resistor element, such as resistor R shown in FIG. 1, and any situation requiring such a resistor element can be satisfied with foam body 10. The resistance of foam body 10 is controlled by the size, geometry and nature of the foam body and the connection of the external wiring to the foam body. The inventor has discovered that due to the nature of foam body 10, Corona discharge does not occur if the body is used in an ESD situation, such as a touch pad or the like. Because the foam can easily be shaped, many assembly advantages can be realized using foam body 10 as a resistor element. Some examples will be presented and discussed below. It is also noted that no soldering or crimping are required to connect foam body 10 into a circuit, thereby leading to still further advantages over prior art resistor elements.

It is also noted that the resistor element of the present invention can also be used in an electrical circuit used to protect equipment or people against the effects of electrostatic discharge (ESD) in the manner of the resistance and inductance disclosed in the incorporated documents.

Several applications of the foam body are shown in the remaining figures.

Figure 5:
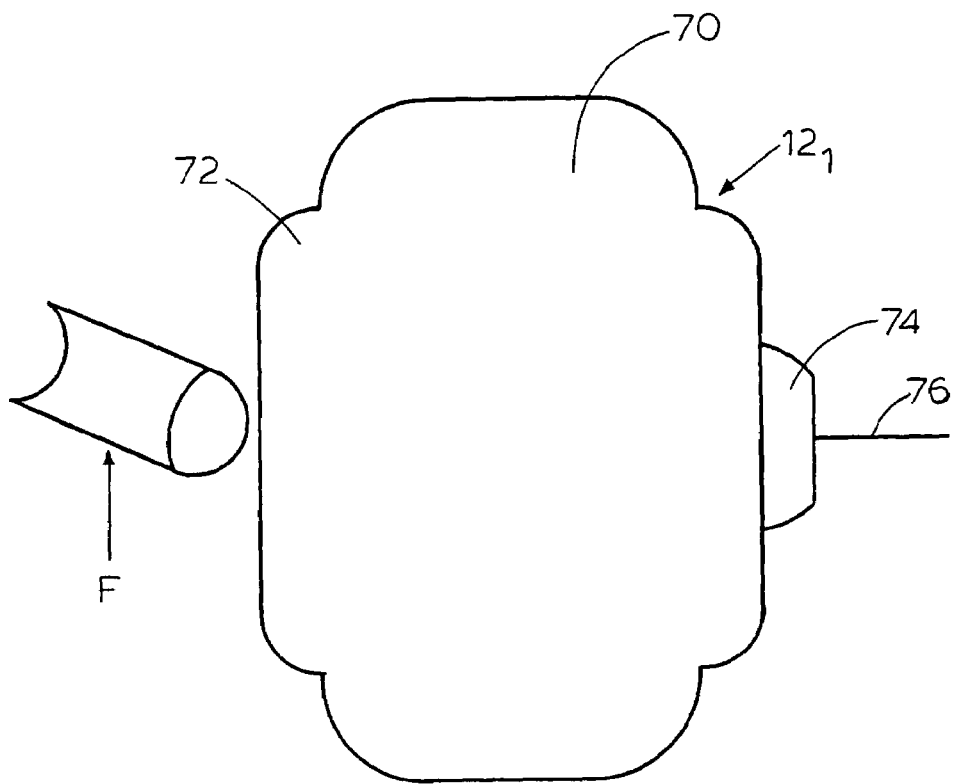
FIG. 5 shows one application of the resistor element of the present invention.

A touch pad application is shown in FIG. 5, with foam pad $12_1$ having a large area 70 sandwiched between two smaller areas 72 and 74. A lead 76 is electrically connected to area 74 and area 72 is used as a touch pad, with a finger F being shown in contact with area 72. The finger can touch the area 72 and then move into the foam body. Any charge on the finger will be dissipated by the initial touch and the movement of the finger into the pad. The very high resistance of the foam body will permit the touching to occur without uncomfortable corona discharge. It is also noted that the foam body can be used to prevent corona discharge from occurring between adjacent elements as well as between a touch pad and a user.

A contact plate 80 is shown in electrical contact with area 72 of foam body $12_2$ in FIG. 6 and a second contact plate 82 is in electrical contact with area 74 of the foam body. A lead 84 is electrically connected to plate 82 and can be connected to another circuit, to another circuit element or to ground. The area of contact between plates 80 and 82 and the foam body is adjusted to control the resistance of the overall circuit unit represented by foam body $12_2$ and the contact plates 80 and 82. As can be understood from the above discussion, the areas associated with the foam body influence the overall resistance of the unit which includes the foam body. Thus, if the area of contact between the foam body and the contact plate is very small, the resistance value of the unit represented by the foam body and the contact plate is very high; whereas, if the area is increased, the resistance is decreased. This permits still further adjustment and designing of the resistance unit. Thus, as can be understood, the resistance of unit 90 shown in FIG. 8 is greater than the resistance of unit 92 shown in FIG. 6 because contact area $A_1$ between plate 80 and area 72 of foam body $12_2$ is greater than contact area $A_2$ between plate 94 and area 72' of foam body $12_3$. It is also noted that contact plate 80 can be a touch pad or a medallion if desired. It is also noted that the term "touch pad" can also include the plates 80 and 82 as well.

The resistance of the unit can be further influenced by adjusting the contact plate itself. Thus, as shown in FIG. 7, an insulator element 96 can be totally or partially interposed between a plate such as plate 80', and the foam body at area, such as area 72". The size, insulative properties and distance of insertion of plate 96 will affect the resistance of unit 98.

Figure 9A:
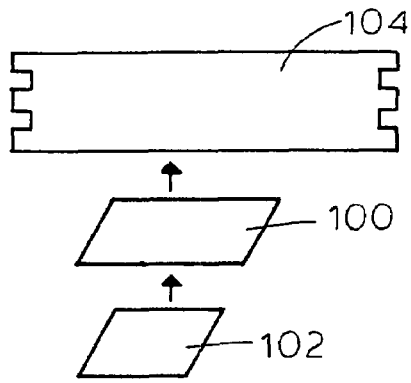
FIG. 9A shows another application of the resistor element of the present invention.
Figure 9B:
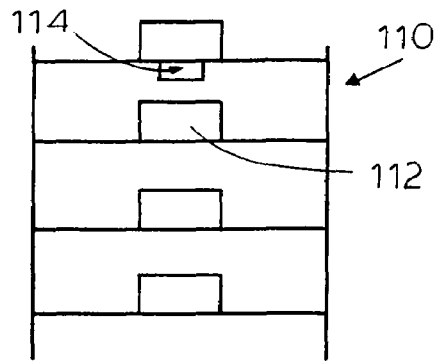
FIG. 9B shows another application of the resistor element of the present invention.

Foam body can also be used as an insulator that is interposed between two adjacent bodies where spacing may not permit use of standard resistors. Thus, as shown in FIG. 9A, a foam body 100 is interposed between body 102 and body 104. Another example of the use of body 104 includes assembly of FIG. 9A on a gas pump case in a gas station or on the gas filler door of your car to prevent the gas station explosions while filling the car. As can be understood from the teaching of the foregoing discussion, the resistance properties of the foam body are three dimensional and thus the thickness-wise resistance of foam body 100 will be just as effective as the resistance properties of the lengthwise or widthwise resistance properties of the foam bodies shown in FIGS. 5-8. This feature will allow the foam body to be used as a second touch area in many situations. For example, as shown in FIG. 9B, a cabinet 110 having a plurality of equipment units, such as equipment unit 112, can include foam bodies, such as foam body 114, interposed therebetween when only front access is available.

Figure 10:
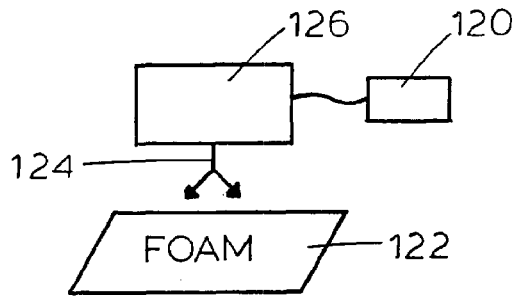
FIG. 10 shows another application of the resistor element of the present invention.

Other variations include placing a second foam body 120 in parallel with a first foam body 122 via a lead 124 which is electrically connected to a contact pad 126 as shown in FIG. 10. This will allow multiple contact elements for a foam pad if physical access is limited.

Figure 11:
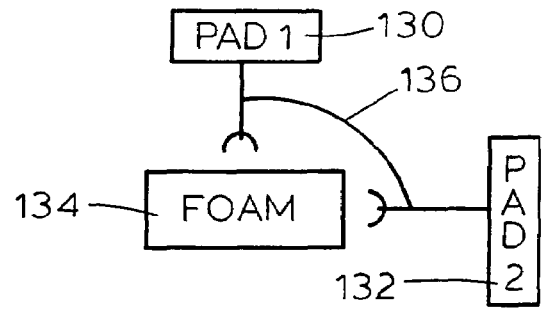
FIG. 11 shows another application of the resistor element of the present invention.

As shown in FIG. 11, two contacts 130 and 132 are connected to a foam body 134 and to each other by a lead 136. The two contacts 130 and 132 act as backups to each other. If one fails, the other will work and will have more resistance due to the smaller area of contact due to the loss of one of the contacts. This is a fail-safe mode in which the failed mode actually has better acceptable ESD resistance characteristics as in the normal mode.

Figure 12:
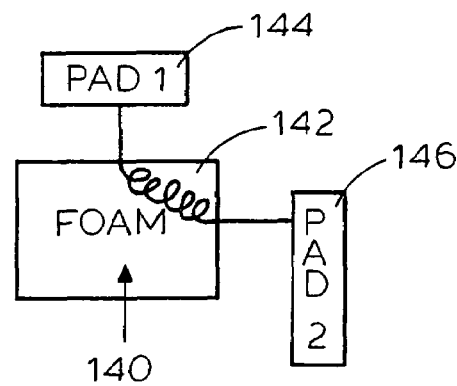
FIG. 12 shows another application of the resistor element of the present invention.

As shown in FIG. 12, a spring element 140 can be in electrical contact with foam body 142 and electrically connect contact 144 to contact 146.

Figure 13:
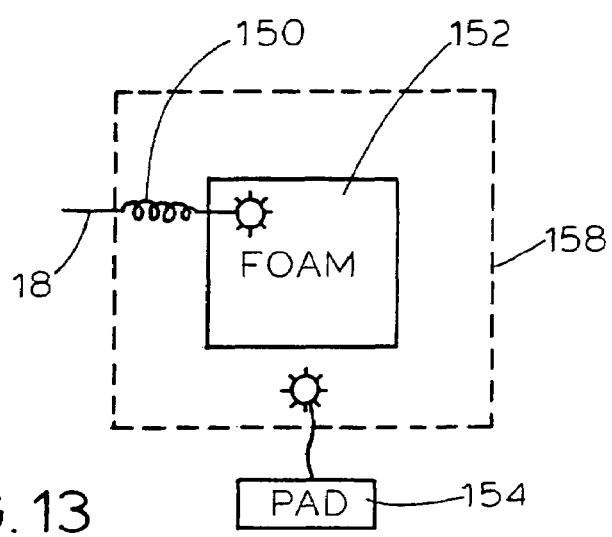
FIG. 13 shows another application of the resistor element of the present invention.

An inductor element 150 can be connected to a foam body 152 as shown in FIG. 13 which has a contact 154 connected thereto. The inductor element is in series with one of the leads, such as lead 18, and has an inductance value that is greater than the stray inductance of any system connected to the unit shown in FIG. 13 via lead 18 at the location of the inductor element. The inductor element will serve the function of high frequency filtering as discussed in the incorporated documents. It is noted that an inductor element can be used in conjunction with any of the embodiments disclosed herein. Foam body 152, contact 154 and inductor element 150 can all be contained in a housing 158 if desired. Likewise, if a resistor element, such as shown in FIG. 1, is used in place of or in conjunction with inductor element 150, that resistor element will have a resistance that is greater than the stray resistance of any system connected to the unit shown in FIG. 13 via lead 18 at the location of the resistor element.

Figure 14:
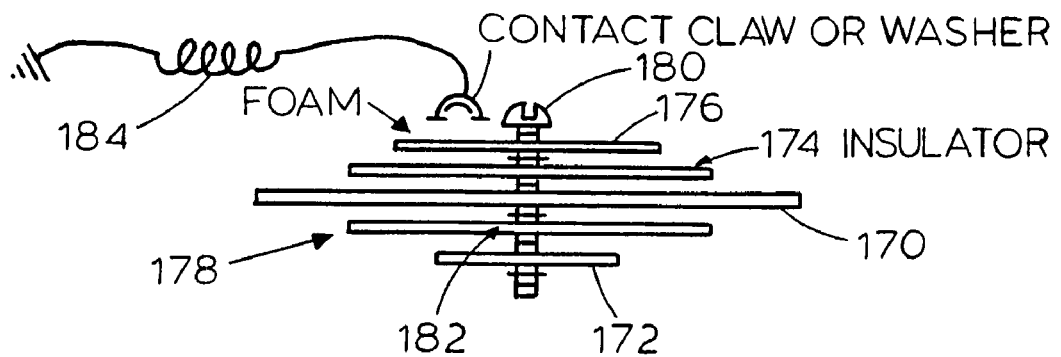
FIG. 14 shows another application of the resistor element of the present invention.

As shown in FIG. 14, an element 170 is sandwiched between a contact 172, such as a touch medallion or the like, and an insulator 174, with insulator 174 being interposed between the element 170 and a foam body 176, with another insulator 178 being located on a second side of the element 170. A fastener 180 holds the elements together and includes a threaded shaft 182. An inductor element 184 can also be included to provide high frequency filtering as discussed in the incorporated documents.

Figure 15:
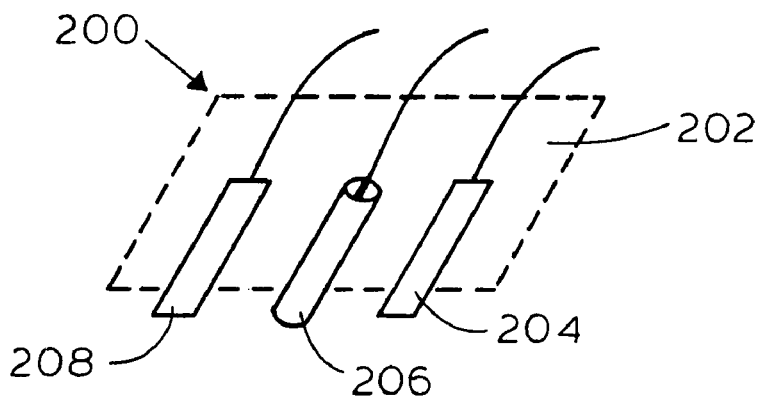
FIG. 15 shows a prior art plug.
Figure 16:
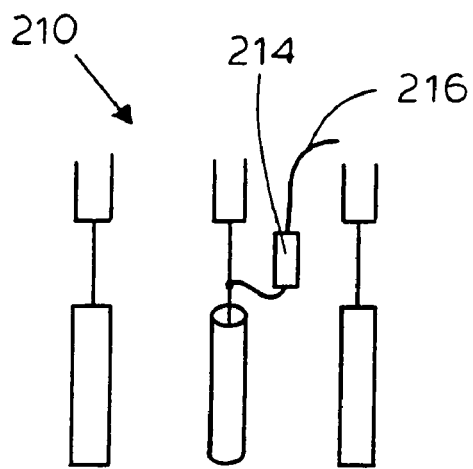
FIG. 16 shows a plug embodying the teaching of the incorporated documents.
Figure 17:
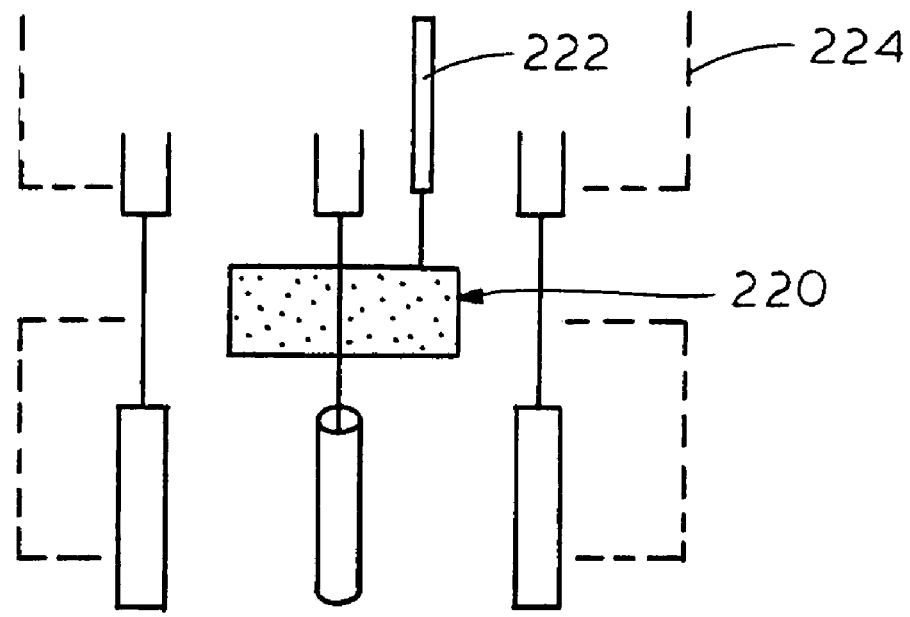
FIG. 17 shows a plug which includes a resistor element embodying the teaching of the present invention.

As discussed in the incorporated documents, ESD protection can be located in a plug. The foam body of the present invention can be used in this context as well. Thus, a prior art plug 200 is shown in FIG. 15 as including a housing 202 and three prongs 204, 206 and 208 which are connected to suitable leads. A plug 210 is shown in FIG. 16 which is modified according to the teaching of the incorporated documents and includes a resistor element 214 connected to an ESD lead 216 (it being noted that an inductor element can also be included as fully discussed in the incorporated documents, but which is not shown in FIG. 16). Plug 210 is modified according to the teaching of the present invention by substituting a foam body 220 for resistor element 214 and connecting an ESD lead 222 thereto. A housing 224 can be included if desired to assure proper placement in a plug housing.

Figure 18:
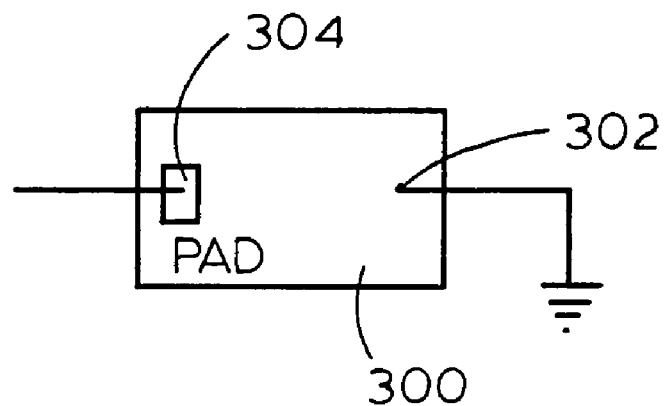
FIG. 18 illustrates a general connection to the pad embodying the teaching of the present invention.

Referring to FIG. 18, it is noted that the pad disclosed herein can be used for a wide variety of purposes, such as grounding a cable that is being withdrawn from a container, grounding a person while the person uses equipment or the like. In such a case, pad 300 will be formed as discussed above, and will include a contact 302 which can be electrically connected to ground or to another element, as well as an area 304 that defines a suitable connection to another element, such as a cable in a container or even a person. Area 304 can be a suitable electrical connector, such as a jack or a clip, or can simply be an area which is touched by a person. Those skilled in the art will understand the design of area 304 based on the teaching of this disclosure and the requirements of the particular situation of concern to them.

While various embodiments of the invention have been described, it will be apparent to those of ordinary skill in the art that many more embodiments and implementations are possible within the scope of this invention. Accordingly, the invention is not to be restricted except in light of the attached claims and their equivalents.

What is claimed is:

1. An element for use in electrical circuits comprising:
    A) a body formed of flexible foam material and having
        (1) an internal structure formed by a plurality of cell-shaped structures, each cell-shaped structure including a plurality of edges
        (2) a plurality of electrically conductive granules located on the edges of each cell-shaped structure, some of the granules being in electrical contact with each other and some of the electrically conductive granules being spaced apart from each other,
        (3) foam material being interposed between adjacent spaced apart electrically conductive granules, the foam material that is interposed between adjacent spaced apart electrically conductive granules being electrically insulating so that the adjacent spaced apart electrically conductive granules having foam material interposed therebetween are electrically insulated from each other,
        (4) an electrically conductive path that is defined through the body by the electrically conductive granules and being defined by the location, orientation and spacing of the electrically conductive granules that are in electrical contact with each other and along with the foam material that is interposed between some adjacent granules, and
        (5) the body having an electrical resistance that is a function of the internal structure and geometry of the body and which is dissipative; and
    B) two electrical contact elements electrically connected to the body, the electrical contact elements being in electrical series with the electrically conductive path defined through the body, each contact element being in contact with the foam body over a defined area of contact which includes some of the electrically conductive path, overall resistance of the body and the electrical contact elements being a function of the internal structure and geometry of the foam body and the geometry of the defined areas of contact between the electrical contact elements and the body.

2. The element defined in claim 1 wherein the defined area associated with one electrical contact element has a size that is different from the defined area associated with a second electrical contact element.

3. The element defined in claim 1 further including an electrical lead connected to one of the two contact elements.

4. The element defined in claim 1 further including an electrical insulating element electrically interposed between at least one of said contact elements and said body.

5. The element defined in claim 1 wherein said body has an external surface and the external surface of said body includes a plurality of different size surfaces with adjacent surfaces being joined together at a corner having a non-zero angle.

6. The element defined in claim 1 wherein one of said contact elements is a touch pad.

7. The element defined in claim 1 further including an electrical conductor electrically connecting said contact elements to each other, said electrical conductor being in electrical contact with said body.

8. The element defined in claim 1 further including an inductor element electrically connected in series with one electrical contact element.

9. The element defined in claim 1 wherein said body has an electrical resistance greater than $10^8$ ohms.

10. The element defined in claim 1 wherein said body has an electrical resistance between $10^8$ ohms and $10^{12}$ ohms.

11. The element defined in claim 1 wherein one electrical contact element is grounded.

12. The element defined in claim 1 wherein one electrical contact element is electrically connected to a system having stray inductance and stray resistance and the electrical resistance of said body measured at the one contact element is greater than the stray resistance.

13. The element defined in claim 8 wherein said inductor element is electrically connected to a system having stray inductance and stray resistance and the inductance of said inductor element is greater than the stray inductance.

14. The element defined in claim 1 further including an electrical conductor electrically connecting said contact elements to each other.

15. An element for use in an electrical circuit used to protect equipment or people against the effects of electrostatic discharge (ESD) comprising:
    A) a body formed of flexible foam material and having
        (1) an internal structure formed by a plurality of cell-shaped structures, each cell-shaped structure including a plurality of edges, some of which intersect
        (2) a plurality of electrically conductive granules located on the edges of each cell-shaped structure, some of the granules being in electrical contact with each other and some of the electrically conductive granules being spaced apart from each other,
        (3) foam material interposed between adjacent spaced apart electrically conductive granules, the foam material that is interposed between spaced apart adjacent granules being electrically insulating so that the adjacent spaced apart electrically conductive granules having foam material interposed therebetween are electrically insulated from each other,
        (4) an electrically conductive path defined through the body by the electrically conductive granules and which is defined by the location, orientation and spacing of the electrically conductive granules in the body along with the foam material that is interposed between some adjacent granules, said electrically conductive path having an electrical resistance that is dissipative, and
        (5) the body having an electrical resistance that is a function of the internal structure and geometry of the body; and
    B) two electrical contact elements electrically connected to the body, the electrical contact elements being in electrical series with the electrically conductive path defined through the body, each contact element being in contact with the foam body over a defined area of contact which includes some of the electrically conductive path, overall resistance of the body and the electrical contact elements being a function of the internal structure and geometry of the foam body and the geometry of the defined areas of contact between the electrical contact elements and the body.

16. The element defined in claim 15 wherein the defined area associated with one electrical contact element has a size that is different from the defined area associated with a second electrical contact element.

17. The element defined in claim 15 further including an electrical insulating element electrically interposed between at least one of said contact elements and said body.

18. The element defined in claim 15 wherein the external surface of said body includes a plurality of different size surfaces with adjacent surfaces being joined together at a corner having a non-zero angle.

19. The element defined in claim 15 wherein one electrical contact element is a touch pad.

20. The element defined in claim 15 wherein said foam body is interposed between two adjacent bodies.

21. The element defined in claim 15 further including an electrical conductor electrically connecting the contact elements to each other, said electrical conductor being in electrical contact with said body.

22. The element defined in claim 15 further including an inductor element electrically connected in series with one contact element.

23. The element defined in claim 15 wherein one contact element is grounded.

24. The element defined in claim 1 further including a second foam body connected to one contact element.

25. The element defined in claim 6 further including a second touch pad electrically connected to the other contact element.

26. The element defined in claim 25 further including an electrical conductor electrically connecting said first and second touch pads together.

27. The element defined in claim 1 further including an inductor element spaced apart from said body and electrically connected to a first contact element; and a touch pad spaced from said foam body and electrically connected to a second contact element.

28. The element defined in claim 1 further including an element to be grounded in electrical contact with said body; a touch pad in electrical contact with said body; said body being electrically interposed between said element to be grounded and said touch pad.

29. The element defined in claim 1 further including an insulator in contact with said body; said insulator being positioned between said body and a contact element, said insulator reducing the effective contact area.

30. The element defined in claim 29 further including an inductor element electrically connected to said body and spaced apart from said body.

31. The element defined in claim 1 further including a plug having a housing, said body being located at least partially in the housing of said plug.

32. The element defined in claim 31 wherein said plug includes two prongs and said body is interposed between the prongs.

33. The element defined in claim 15 further including a plug having a housing, said body being located at least partially in the housing of said plug.

34. The element defined in claim 33 further including an inductor element electrically connected to said body.

35. The element defined in claim 34 wherein said inductor element is connected to a system having a stray inductance, and said inductor element has an inductance greater than the stray inductance of the system at the location where said inductor element is connected to the system.

36. A method of forming a resistor element for use in an electrical circuit comprising:
A) forming a body of flexible foam material;
B) forming an internal structure of the body by providing a plurality of cell-shaped structures and providing each cell-shaped structure with a plurality of edges;
C) providing a plurality of electrically conductive granules on the edges of each cell-shaped structure, placing some of the granules being in electrical contact with each other and spacing other electrically conductive granules apart from each other;
D) providing some of the foam material with electrically insulating properties;
E) interposing the electrically insulating foam material between adjacent spaced apart electrically conductive granules and electrically isolating adjacent spaced apart electrically conductive granules having electrically insulating foam material interposed therebetween from each other;
F) defining an electrically conductive path through the body using the electrically conductive granules which are in electrical contact with each other and defining the path by the location, orientation and spacing of the electrically conductive granules in the body along with the electrically insulating foam material that is interposed between some adjacent granules, whereby the body is provided with an electrical resistance that is a function of the internal structure and geometry of the body;
G) electrically connecting two electrical contact elements to the body;
H) placing the electrical contact elements in electrical series with the electrically conductive path defined through the body; and
I) placing each contact element in contact with the foam body over a defined area of contact and including some of the electrically conductive path in the defined area of contact between each contact element and the body whereby the overall resistance of the body and the electrical contact elements is a function of the internal structure and geometry of the foam body and the geometry of the defined areas of contact between the electrical contact elements and the body.

37. The method defined in claim 36 further including adjusting the overall resistance of the body by adjusting the size and geometry of the defined area of contact of at least one of the contact elements.

38. The method defined in claim 36 further including adjusting the overall resistance of the body by adjusting the geometry of the body.

39. A method of preventing corona discharge comprising:
A) forming a body of flexible foam material;
B) forming an internal structure of the body by providing a plurality of cell-shaped structures and providing each cell-shaped structure with a plurality of edges;
C) providing a plurality of electrically conductive granules on the edges of each cell-shaped structure, placing some of the granules being in electrical contact with each other and spacing other electrically conductive granules apart from each other;
D) providing some of the foam material with electrically insulating properties;
E) interposing the electrically insulating foam material between adjacent spaced apart electrically conductive granules and electrically isolating adjacent spaced apart electrically conductive granules having electrically insulating foam material interposed therebetween from each other;

F) defining an electrically conductive path through the body using the electrically conductive granules which are in electrical contact with each other and defining the path by the location, orientation and spacing of the electrically conductive granules in the body along with the electrically insulating foam material that is interposed between some adjacent granules, whereby the body is provided with an electrical resistance that is a function of the internal structure and geometry of the body;

G) electrically connecting two electrical contact elements to the body;

H) placing the electrical contact elements in electrical series with the electrically conductive path defined through the body;

I) placing each contact element in contact with the foam body over a defined area of contact and including some of the electrically conductive path in the defined area of contact between each contact element and the body whereby the overall resistance of the body and the electrical contact elements is a function of the internal structure and geometry of the foam body and the geometry of the defined areas of contact between the electrical contact elements and the body; and J) connecting a touch pad to one of the electrical contact elements.

40. The element defined in claim 15 further including a touch pad and wherein one electrical contact element is connected to the touch pad.

41. The element defined in claim 34 wherein one electrical contact element if said two electrical contact elements includes a prong and the second electrical contact element of said two electrical contact elements is connected to an ESD grounding wire.

42. An element for use in electrical circuits comprising:
A) a body formed of flexible foam material and having
    (1) an internal structure formed by a plurality of cell-shaped structures, each cell-shaped structure including a plurality of edges
    (2) a plurality of electrically conductive granules located on the edges of each cell-shaped structure, some of the granules being in electrical contact with each other and some of the electrically conductive granules being spaced apart from each other,
    (3) foam material being interposed between adjacent spaced apart electrically conductive granules, the foam material that is interposed between adjacent spaced apart electrically conductive granules being electrically insulating so that the adjacent spaced apart electrically conductive granules having foam material interposed therebetween are electrically insulated from each other,
    (4) an electrically conductive path that is defined through the body by the electrically conductive granules and being defined by the location, orientation and spacing of the electrically conductive granules that are in electrical contact with each other and along with the foam material that is interposed between some adjacent granules, and
    (5) the body having an electrical resistance that is a function of the internal structure and geometry of the body and which is dissipative; and
B) an electrical contact element electrically connected to the body, the electrical contact element being in electrical series with the electrically conductive path defined through the body and being in contact with the foam body over a defined area of contact which includes some of the electrically conductive path, overall resistance of the body and the electrical contact elements being a function of the internal structure and geometry of the foam body and the geometry of the defined areas of contact between the electrical contact element and the body.

43. An element for use in electrical circuits comprising:
A) a body formed of flexible foam material and having
    (1) an internal structure formed by a plurality of cell-shaped structures, each cell-shaped structure including a plurality of edges
    (2) a plurality of electrically conductive granules located on the edges of each cell-shaped structure, some of the granules being in electrical contact with each other and some of the electrically conductive granules being spaced apart from each other,
    (3) foam material being interposed between adjacent spaced apart electrically conductive granules, the foam material that is interposed between adjacent spaced apart electrically conductive granules being electrically insulating so that the adjacent spaced apart electrically conductive granules having foam material interposed therebetween are electrically insulated from each other,
    (4) an electrically conductive path that is defined through the body by the electrically conductive granules and being defined by the location, orientation and spacing of the electrically conductive granules that are in electrical contact with each other and along with the foam material that is interposed between some adjacent granules, and
    (5) the body having an electrical resistance that is a function of the internal structure and geometry of the body and which is dissipative;
B) an electrical contact element electrically connected to the body, the electrical contact element being in electrical series with the electrically conductive path defined through the body and being in contact with the foam body over a defined area of contact which includes some of the electrically conductive path, overall resistance of the body and the electrical contact elements being a function of the internal structure and geometry of the foam body and the geometry of the defined areas of contact between the electrical contact element and the body; and
c) a portion of the foam body being located and positioned to be exposed and positioned to serve as a contact area for permitting contact by the entity to be drained of its electrostatic charge.

* * * * *